United States Patent [19]
Mochizuki et al.

[11] Patent Number: 4,983,421
[45] Date of Patent: Jan. 8, 1991

[54] METHOD FOR PRODUCING MAGNETIC RECORDING MEDIA

[75] Inventors: Kouichi Mochizuki; Hiromi Nakahara; Tadashi Yasunaga, all of Kanagawa, Japan

[73] Assignee: Fuji Photo Film Co., Ltd., Kanagawa, Japan

[21] Appl. No.: 449,339

[22] Filed: Dec. 13, 1989

Related U.S. Application Data

[63] Continuation of Ser. No. 92,260, Sep. 2, 1987, abandoned.

[30] Foreign Application Priority Data

Sep. 2, 1986 [JP] Japan ................................ 61-205042

[51] Int. Cl.$^5$ ............................................ B05D 5/12
[52] U.S. Cl. ..................................... 427/130; 427/128; 427/132
[58] Field of Search .............................. 427/127–132, 427/48; 428/695, 900

[56] References Cited

U.S. PATENT DOCUMENTS 3,681,225  8/1972  Genna et al. ................... 427/130 X
4,254,585  3/1981  Schoettle et al. ................. 427/130

FOREIGN PATENT DOCUMENTS 48-38711  6/1973  Japan .
0155668  8/1985  Japan .

Primary Examiner—Bernard Pianalto
Attorney, Agent, or Firm—Sughrue, Mion, Zinn, Macpeak & Seas

[57] ABSTRACT

A method is described for producing a metal thin film type magnetic recording medium having a ferromagnetic metal or alloy thin film provided on a non-magnetic support, comprising the steps of forming said ferromagnetic metal or alloy thin film on said non-magnetic support, and then buffing the surface of said ferromagnetic metal or alloy thin film with nonwoven fabric.

15 Claims, 1 Drawing Sheet

METHOD FOR PRODUCING MAGNETIC RECORDING MEDIA

This is a continuation of application Ser. No. 07/092,260, filed Sept. 2, 1987.

FIELD OF THE INVENTION

The present invention relates to a method of producing a magnetic recording medium, and particularly relates to a method of producing a metal thin film type magnetic recording medium improved in reduction of drop-outs and error rate and excellent in running characteristics.

BACKGROUND OF THE INVENTION

Heretofore, so-called "coating type" magnetic recording media, which are formed by applying iron oxide type magnetic powders dispersed in various kinds of binders onto supports, have been generally used as magnetic recording media for audio, video, computer, and the like. Requirements for such magnetic recording media, however, have become strict in view of the desire to reduce the recording wavelength and the tracking width in order to attain higher recording density. As a result, the development of "metal thin film type" magnetic recording media substantially suitable for short-wavelength recording are now in progress and have been partially put into practice.

The intention to reduce the recording wavelength and the tracking width is strict to preclude signal missing, or, in other words, drop-outs or error rate in digital use. For example, assuming an 8 mm video as a system using a tape, it is required, as a practical drop-out level, that drop-outs from −18 dB are not more than about 20 per minute. In the case of a "coating type" medium having a thick magnetic layer of the order of several microns, deficiencies or dust on the support is often hidden by the processing, such as a smoothing process due to coating, a calendering process after coating, or the like, so that signal missing can not be found. Contrarily in the case of a "metal thin film type" medium having a thin magnetic layer of the order of 0.05 to 0.5 μm, not only do deficiencies on the support appear as deficiencies on the surface of the magnetic layer, but also the process, such as calendering process or the like, necessary for manufacturing a "coating type" medium, is nonexistent. Accordingly, in the case of a "metal thin film" type medium, great care must be taken to avoid missing signal characteristics.

SUMMARY OF THE INVENTION

The present invention has been achieved in order to solve problems in the art, and in particular, an object of the present invention is to provide a method for producing a metal thin film type magnetic recording medium showing improvement in reduction of drop-outs and error rate.

Another object of the invention is to provide a method for producing a metal thin film type magnetic recording medium having improved running characteristics.

The present invention is directed to a method for producing a metal thin film type magnetic recording medium having a ferromagnetic metal or alloy thin film provided on a non-magnetic support, comprising the steps of forming the ferromagnetic metal or alloy thin film on the non-magnetic support, and then buffing the surface of the ferromagnetic metal or alloy thin film with nonwoven fabric.

Figure 1:
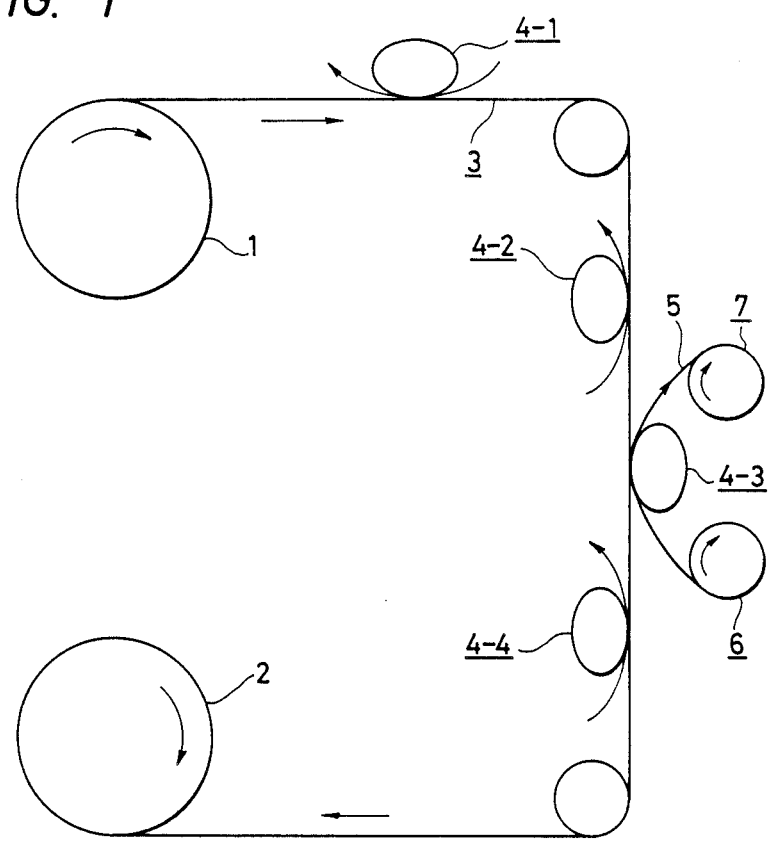
FIGS. 1 and 2 are drawings illustrating the method for producing a magnetic recording medium according to the present invention.

In the drawings, 1 is a feed reel, 2 is a take-up reel, 3 is a tape-like medium, 4-1 to 4-4 are guides, 5 is a nonwoven fabric, 8 is a disk-like medium, 10 is a nonwoven fabric, and 11 is a guide.

DETAILED DESCRIPTION OF THE INVENTION

The non-magnetic support used in the present invention may be a non-magnetic flexible support or may be a non-magnetic inflexible support. Typically, the former is provided in the form of a tape, the latter in the form of a disk. Examples of materials for the non-magnetic flexible support include cellulose acetates, cellulose nitrates, ethylcelluloses, methylcelluloses, polyamides, polymethyl methacrylates, polytetrafluorethylenes, polytrifluorethylenes, polymers or copolymers of α-olefins such as ethylene and propylene, vinyl chloride polymers and copolymers, polyvinylidene chlorides, polyimides, polyesters such as polyethylene terephthalate, and the like. However, it is preferable to use a plastic support made of polyethylene terephthalate, polyamide or polyimide. Preferably, the thickness of the support is selected to be 4 to 50 μm. Further, a foundation layer may be provided on the support for the purpose of improvement in adhesion and magnetic characteristics of the ferromagnetic metal or alloy thin film (hereinafter generically referred to as "metal thin film"). Examples of materials for the ferromagnetic metal thin film provided on the support are ferromagnetic metals, such as iron, cobalt, nickel and the like; and ferromagnetic alloys, such as Fe—Co, Fe—Ni, Co—Ni, Fe—Rh, Co—P, Co—B, Co—Y, Co—La, Co—Ce, Co—Pt, Co—Sm, Co—Cr, Fe—Co—Ni, Co—Ni—P, Co—Ni—B, Co—Ni—Ag, Co—Ni—Nb, Co—Ni—Ce, Co—Ni—Zn, Co—Ni—Cu, Co—Ni—W, Co—Ni—Re, and the like. The ferromagnetic metal thin film is formed by any suitable one of electroplating, electroless plating, gas phase plating, sputtering, evaporating, ion plating and the like, The thickness of the metal thin film is generally selected to be within a range of from 0.02 to 2 μm, and preferably is within a range of 0.05 to 0.4 μm.

The ferromagnetic metal thin film may further include O, N, Cr, Ga, As, Sr, Zr, Nb, Mo, Rh, Pd, Sn, Sb, Te, Pm, Re, Os, Ir, Au, Hg, Pb, Bi, or the like, Further, if desired, a foundation layer or a subbing layer may be formed on the metal thin film, or the metal thin film may be suitably multilayered.

A protective layer may be formed on the metal thin film by applying a known liquid or solid lubricant onto the metal thin film or by applying a protective film of silicon oxide onto the metal thin film. Further, in the case where the medium is used as a tape-like medium, a back coating layer may be formed on the rear surface of the support opposite to the metal thin film for the purpose of improvement in running characteristics. In the case where the lubricant is provided, any one of known liquid lubricants and solid lubricants, that is to say, for example, myristic acid, palmitic acid, stearic acid, and the like, can be suitably used.

The buffing treatment with nonwoven fabric in accordance with the present invention is carried out by moving the metal thin film type magnetic recording medium relative to the nonwoven fabric while keeping the surface of the metal thin film type magnetic recording medium in contact with the nonwoven fabric. More specifically, the buffing treatment is preferably carried out by moving the metal thin film type magnetic recording medium and the nonwoven fabric in directions opposite to each other, so that the surface of the metal thin film in the magnetic recording medium is rubbed by the nonwoven fabric so as to be smoothed, thereby. Consequently, drop-outs and error rate can be reduced and running characteristics can be improved. Any material can not always be used in buffing treatment, but the use of nonwoven fabric can produce good results.

The buffing treatment with nonwoven fabric in accordance with the present invention is described below in further detail. Referring now to FIG. 1. there is shown an embodiment of an apparatus used in the buffing treatment of the invention, in which the magnetic recording medium (tape) provided with the ferromagnetic metal thin film formed on its opposite surfaces is fed from a feed reel 1 at a speed of 0.5 to 1.5 m per minute, buffed with nonwoven fabric and taken up by a take-up reel 2. In this embodiment, such buffing treatment can be carried out at four places if necessary. The reference numerals 4-1, 4-2, 4-3 and 4-4 designate guides for keeping the recording medium in contact with the nonwoven fabric moved at a speed of 0 to 10 m per minute. As shown in FIG. 1, the nonwoven fabric 5 is fed from a feed reel 6 to a take-up reel 7 so that the nonwoven fabric is moved relative to the recording medium while keeping the nonwoven fabric in contact with the recording medium at the place of the guide 4-3. If the nonwoven fabric slightly touches the recording medium, the object of the buffing treatment can be attained. Although each of the guides 4-1, 4-2 and 4-4 has the same mechanism as the guide 4-3, the mechanisms of the guides for 4-1, 4-2, and 4-4 are omitted in the drawing. Each of the guides must have a convex curved surface suitable for keeping the nonwoven fabric in contact with the recording medium. Accordingly, the respective guides are made to be circular or elliptical in sectional shape. Although it is preferable to make the guides elliptical in section as shown in the drawing, in order to increase the contact area of the nonwoven fabric, the guides may be circular, and in the case where the guides are made circular, the guides may be designed to be rotatable.

The metal thin film type magnetic recording medium and the nonwoven fabric may be moved in the same direction, as long as the recording medium is moved relative to the nonwoven fabric while keeping the recording media in contact with the nonwoven fabric. In this case, however, the speed difference between the recording medium and the nonwoven fabric tends to be diminished. Accordingly, when the recording medium and the nonwoven fabric are moved in opposite directions as shown in FIG. 1, the effect of the invention can be obtained more remarkably. Examples of materials of the nonwoven fabric having a large effect are polyesters or polyurethane-impregnated polyesters (for example, VILENE, trademark for product of Japan Vilene Co., Ltd., and ECSAINE, Toray Industries, Inc.), polyester-Nylon composites (for example, SAVINA, trademark for product of Kanebo Ltd.), and the like.

Figure 2:
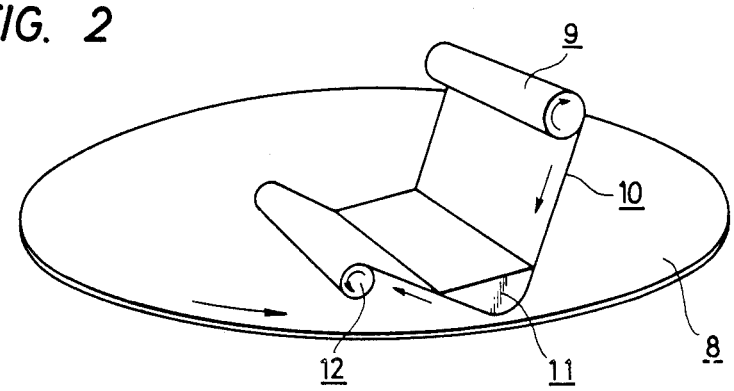

Referring to FIG. 2, there is shown another embodiment in the buffing treatment applied to a disk-like magnetic recording medium instead of the tape-like magnetic recording medium. In this embodiment, a rotating disk 8 is moved relative to nonwoven fabric 10 which is moving along a guide 11 in the direction of the arrow, while keeping the disk 8 in contact with the nonwoven fabric 10 at a lower portion of the guide 11. The nonwoven fabric 10 is fed from a feed reel 9 to a take-up reel 12.

EXAMPLE

In the following example, an embodiment of the present invention is described in detail.

A partially oxidized metal thin film of $Co_{80}Ni_{20}$ was formed on a 12 $\mu$m thick support of polyethylene terephthalate by a general take-up type oblique evaporating method. In other words, an alloy of $Co_{80}Ni_{20}$ was heated and evaporated in a vacuum chamber by an electron beam to prepare a 1600 Å thick film by oblique-evaporation at an incident angle $\theta_{min}$ of 35 degrees. In the process of preparing the film, oxygen gas was introduced into the vacuum chamber to produce a vacuum state of $1.0 \times 10^{-4}$ Torr so that the metal thin film was partially oxidized. As a result, a metal thin film comprising mixture of $Co_{80}Ni_{20}$, $(Co_{80}Ni_{20})O$, $(Co_{80}Ni_{20})_2O_3$, etc., which is a partially oxidized metal thin film, was obtained. In order to improve running characteristics, a back coating layer was applied to the thus prepared medium to cover the lower (bottom) surface of the support on which the metal thin film layer was not formed. Further, a solution obtained by dissolving myristic acid in MEK (methylethyl keton) was applied to the upper surface of the metal thin film to such an extent that 6 mg/m² of myristic acid was formed on the upper surface, and then dried.

The thus prepared raw recording medium was cut into an 8 mm width and then buffed with nonwoven fabric by an apparatus as shown in FIG. 1, except that the apparatus had guides provided only on the metal thin film layer side of the recording medium to carry out buffing treatment on that side. ECSAINE was used as the nonwoven fabric. The thus prepared tape was incorporated into an 8 mm cassette, and then the number of drop-outs and the coefficient of friction were measured.

The measurement of the number of drop-outs was carried out by counting $\mu$sec-18 dB drop-outs which occurred over a one-minute period during tape running in an available video recorder (trade-name: FUJIX-8, Fuji Photo Film Co., Ltd.). On the other hand, the measurement of the coefficient of friction was carried out by measuring an IEC method coefficient of friction against SUS420J stainless pole guides based on 100 passes.

The results of the measurement are shown in Table 1.

TABLE 1

| | Number of Drop-outs 15 $\mu$s-18 dB | Value of $\mu$ IEC method, 100 passes |
|---|---|---|
| Example according to the Invention | 15 per minute | 0.20 |
| Comparative Example (No buffing treatment with nonwoven fabric | 120 per minute | 0.27 |

It is apparent from the foregoing results of measurement that a magnetic recording medium improved in the number of drop-outs and having a small coefficient of friction can be produced according to the present invention. It is, however, necessary that nonwoven fabric is used for the buffing treatment. If other materials are used for the buffing treatment, the same effect is not always attained.

According to the present invention, great improvements are attained in avoiding the missing of signals, such as drop-outs and the like. Further, the coefficient of friction can be reduced to effectuate improvement in running characteristics.

The metal thin film type recording medium is moved relative to the nonwoven fabric while keeping the metal thin film surface of the recording medium in contact with the nonwoven fabric, so that the surface of the metal thin film is smoothed by rubbing of the nonwoven fabric. It can be considered that drop-outs and error rate can be reduced by the aforementioned reason, but the detail of such a mechanism is still unknown.

In the case where a protective layer is provided on the metal surface of the magnetic recording medium, the invention has a further effect of improvement in running characteristics due to a lubricant and the like.

Having thus generally described the process of the present invention and discussed specific embodiments in support thereof, it is to be understood that no undue restrictions as to the scope of the present invention are to be imposed by reason thereof.

What is claimed is:

1. A method for producing a metal thin film type magnetic recording medium having a ferromagnetic metal or alloy thin film provided on a non-magnetic support, comprising the steps of:
   forming said ferromagnetic metal or alloy thin film on said non-magnetic support;
   providing a lubricant having —COOH or —COOM in its molecule, M denoting metal, on the surface of said ferromagnetic metal or alloy thin film; and
   then buffing said lubricant with a non-woven fabric selected from the group consisting of polyesters, polyruethane-impregnated polyesters, and polyester-Nylon composites, said buffing being conducted so that the lubricant molecules become regularly oriented.

2. A method for producing a magnetic recording medium according to claim 1, wherein said lubricant has a —COOH in its molecule.

3. A method for producing a magnetic recording medium according to claim 2, wherein said lubricant is selected from the group consisting of myristic acid, palmitic acid and stearic acid.

4. A method for producing a magnetic recording medium according to claim 1, wherein said metal thin film type magnetic recording medium and said nonwoven fabric are moved in opposite directions to each other while keeping the surface of said metal thin film type magnetic recording medium in contact with nonwoven fabric when the surface of said ferromagnetic metal or alloy thin film is buffed with said nonwoven fabric.

5. A method for producing a magnetic recording medium according to claim 3 wherein said metal thin film type magnetic recording medium is moved relative to said nonwoven fabric while keeping the surface of said metal thin film type magnetic recording medium in contact with said nonwoven fabric when the surface of said ferromagnetic metal or alloy thin film is buffed with said nonwoven fabric.

6. A metal for producing a magnetic recording medium according to claim 5, wherein said metal thin film type magnetic recording medium and said non-woven fabric are moved in opposite directions to each other while keeping the surface of said metal thin film type magnetic recording medium in contact with said nonwoven fabric when the surface of said ferromagnetic metal or alloy thin film is buffed with said non-woven fabric.

7. A method for producing a magnetic recording medium according to claim 3, wherein said non-magnetic support is formed of polyethylene terephthalate, polyamide or polyimide.

8. A method for producing a magnetic recording medium according to claim 7, wherein the thickness of the support is from 4 to 50 $\mu$m.

9. A method for producing a magnetic recording medium according to claim 1, wherein said lubricant is a higher saturated fatty acid.

10. A method for producing a metal thin film type magnetic recording medium according to claim 1, wherein said metal thin film comprises iron, cobalt or nickel, or said thin film comprises a ferromagnetic alloy.

11. A method for producing a metal thin film type magnetic recording medium according to claim 10, wherein said alloy is selected from the group consisting of Fe—Co, Fe—Ni, Co—Ni, Fe—Rh, Co—P, Co—B, Co—Y, Co—La, Co—Ce, Co—Pt, Co—Sm, Co—Cr, Fe—Co—Ni, Co—Ni—P, Co—Ni—B, Co—Ni—Ag, Co—Ni—Nb, Co—Ni—Ce, Co—Ni—Zn, Co—Ni—Cu, Co—Ni—W and Co—Ni—Re.

12. A method for producing a metal thin film type magnetic recording medium according to claim 11, wherein said metal thin film further comprises an element selected from the group consisting of O, N, Cr, Ga, As, Sr, Zr, Nb, Mo, Rh, Pd, Sn, Sb, Te, Pm, Re, Os, Ir, Au, Hg, Pb and Bi.

13. A method for producing a metal thin film type magnetic recording medium according to claim 10, wherein said metal thin film further contains an element selected from the group consisting of O, N, Cr, Ga, As, Sr, Zr, Nb, Mo, Rh, Pd, Sn, Sb, Te, Pm, Re, Os, Ir, Au, Hg, Pb and Bi.

14. A method for producing a metal thin film type magnetic recording medium according to claim 1, wherein the thickness of the metal thin film is from 0.02 to 2 $\mu$m.

15. A method for producing a metal thin film type magnetic recording medium according to claim 14, wherein said thickness is within a range of from 0.05 to 0.4 $\mu$m.

* * * * *